United States Patent
Jain et al.

(10) Patent No.: US 7,615,458 B2
(45) Date of Patent: Nov. 10, 2009

(54) ACTIVATION OF CMOS SOURCE/DRAIN EXTENSIONS BY ULTRA-HIGH TEMPERATURE ANNEALS

(75) Inventors: Amitabh Jain, Allen, TX (US); Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/764,980

(22) Filed: Jun. 19, 2007

(65) Prior Publication Data

US 2008/0318387 A1      Dec. 25, 2008

(51) Int. Cl.
*H01L 21/331* (2006.01)
(52) U.S. Cl. ............... 438/376; 438/369; 438/303
(58) Field of Classification Search ......... 438/299–308, 438/369–376, 229–233
See application file for complete search history.

(56) References Cited

U.S. PATENT DOCUMENTS

| 7,033,879 B2 * | 4/2006 | Hornung et al. ............ 438/231 |
| 7,078,302 B2 * | 7/2006 | Ma et al. .................... 438/299 |
| 2006/0088969 A1 | 4/2006 | Jain |
| 2006/0154475 A1 | 7/2006 | Mehrotra et al. |
| 2006/0199346 A1 | 9/2006 | Jain |
| 2007/0020900 A1 | 1/2007 | Jain |

* cited by examiner

*Primary Examiner*—Dung A. Le
(74) *Attorney, Agent, or Firm*—Warren L. Franz; Wade J. Brady, III; Frederick J. Telecky, Jr.

(57) ABSTRACT

A method of manufacturing a semiconductor device that includes forming a gate dielectric layer over a semiconductor substrate. A gate electrode is formed over the gate dielectric layer. A dopant is implanted into an extension region of the substrate, with an amount of the dopant remaining in a dielectric layer adjacent the gate electrode. The substrate is annealed at a temperature of about 1000° C. or greater to cause at least a portion of the amount of the dopant to diffuse into the semiconductor substrate.

17 Claims, 5 Drawing Sheets

ACTIVATION OF CMOS SOURCE/DRAIN EXTENSIONS BY ULTRA-HIGH TEMPERATURE ANNEALS

TECHNICAL FIELD

The embodiments discussed herein are directed to formation of source/drain extensions of field effect transistors.

BACKGROUND

In the continuing effort to improve performance of transistors and integrated circuits (ICs) in which they are used, semiconductor device designers strive to increase the switching speed of the transistors as manufacturing technology advances. One aspect of this effort includes shrinking the dimensions of transistor features. As physical dimensions of the transistor decrease, some undesirable effects may become non-negligible.

One structural feature of some MOS transistors is a source/drain extension. The source/drain extension is a relatively shallow portion of the source/drain region adjacent the gate electrode of the transistor. One purpose served by the source/drain extension is to reduce the electrical field gradient at the transition from the source or drain to the channel region of the transistor. Reduction of the gradient reduces hot carrier effects that may result in reduced lifetime or performance stability of the transistor. Design objectives with respect to the source/drain extensions include low sheet resistance and shallow junction depth.

SUMMARY

To further the above-discussed objectives, there is provided, in one embodiment, a method of manufacturing a semiconductor device. A gate dielectric layer is formed over a semiconductor substrate, and a gate electrode is formed over the gate dielectric layer. A dopant is implanted into an extension region of the substrate, with an amount of the dopant remaining in a dielectric layer adjacent the gate electrode. The substrate is annealed at a temperature of about 1100° C. or greater to cause at least a portion of the amount of the dopant to diffuse into the semiconductor substrate.

Another embodiment is a method of manufacturing a semiconductor device. A gate dielectric layer is formed over a semiconductor substrate. A gate electrode layer is placed over the gate dielectric layer. The gate electrode layer and the gate dielectric layer are patterned to form a gate electrode structure. A dopant is implanted into an extension region of the substrate, with an amount of the dopant remaining in a dielectric layer adjacent the gate electrode structure. The substrate is annealed for a period of about 2 ms or less and at a temperature of at least about 1100° C. to cause at least a portion of the amount of the dopant to diffuse from the dielectric layer adjacent gate structure the into the semiconductor substrate.

Another embodiment is a semiconductor device. The semiconductor device includes a transistor formed by placing a gate dielectric layer over a semiconductor substrate. A gate electrode is formed over the gate dielectric layer. A dopant is implanted into an extension region of the substrate, with an amount of the dopant remaining in a dielectric layer adjacent the gate electrode. The substrate is annealed for a period of about 2 ms or less to cause at least a portion of the amount of the dopant to diffuse into the semiconductor substrate. Dielectric layers formed over the transistor, and interconnects are formed within the dielectric layers. The interconnects are configured to connect the transistor to other circuit components.

BRIEF DESCRIPTION OF THE DRAWINGS

Reference is now made to the following descriptions taken in conjunction with the accompanying drawings, in which.

DETAILED DESCRIPTION

The embodiments described herein recognize that improved doping of source/drain extensions of a MOS transistor may be effected by the use of an ultra-short, ultra-high temperature anneal after implantation of dopant into lightly-doped drain regions and before removal of a dielectric layer through which the dopant is implanted.

Figure 1:
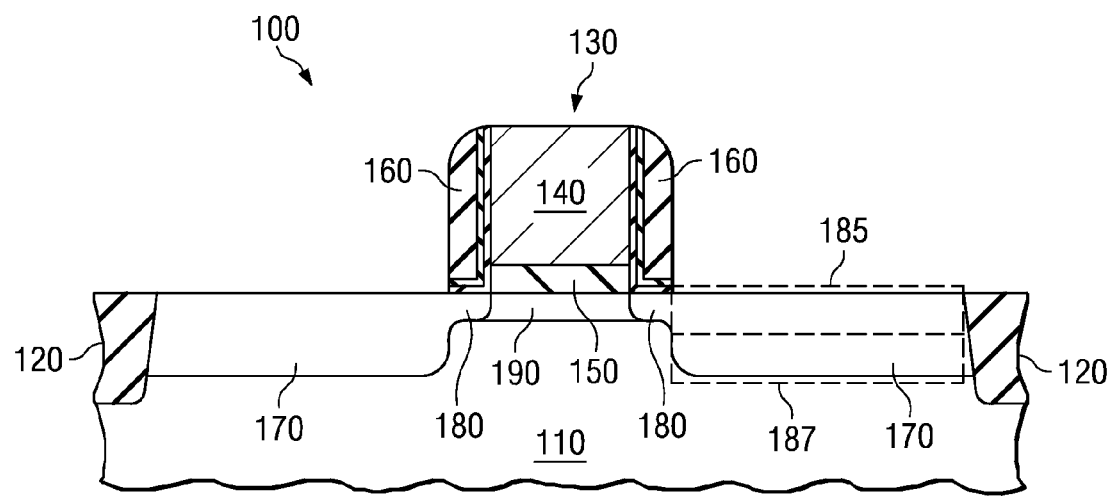
FIGS. 1-4, 6 and 8 illustrate a transistor in various stages of formation.

FIG. 1 illustrates a completed MOS transistor 100. Reference will be made throughout this discussion to the structural elements of FIG. 1. The transistor 100 is an nMOS or a pMOS transistor unless otherwise indicated. The transistor 100 includes a substrate 110 and isolation structure 120. A gate structure 130 includes a gate electrode 140 and a gate dielectric 150. Source/drain spacers 160 are formed on the sidewalls of the gate structure 130. Source/drains 170 include source/drain extension regions 180. A source/drain extension region 180 is formed when a lightly-doped region 185 and a source/drain region 187 merge as a result of thermal processing subsequent to implantation of dopants in the regions 185, 187. A channel 190 is between the source/drain extension regions 180.

Figure 2:
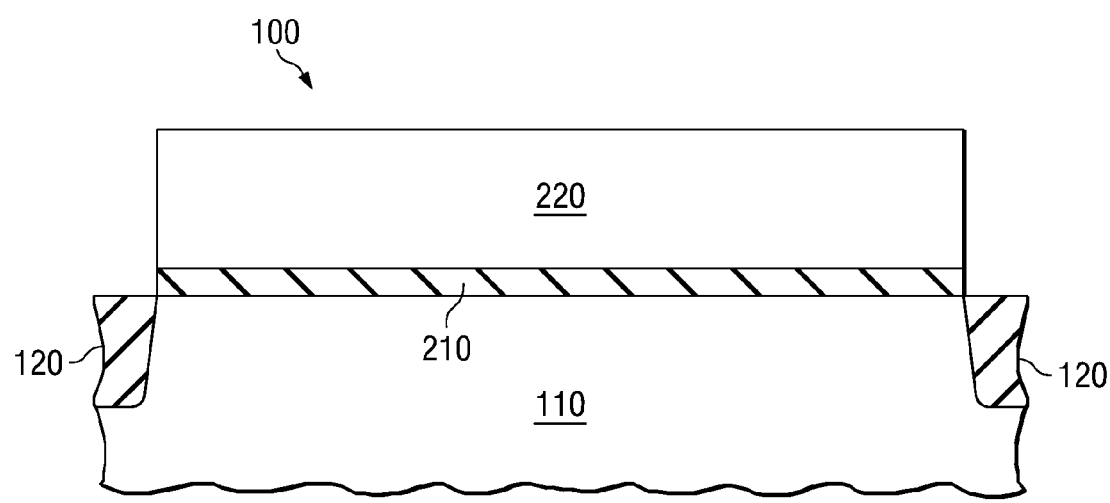

FIG. 2 illustrates the transistor 100 at a stage of manufacture. The substrate 110 may be any semiconducting substrate, but is treated as a silicon wafer in the following discussion. A gate dielectric layer 210 overlies the substrate 110. The gate dielectric layer 210 may be a thermally grown oxide of the substrate 110, but is not limited to this embodiment. For example, in some cases, the gate dielectric layer 210 may be a "high-k" dielectric layer, that is any material that has a dielectric constant greater than that of silicon dioxide. A gate electrode layer 220 overlies the gate dielectric layer 210. In some cases, the gate electrode layer 220 is a polysilicon layer. In other cases, the gate electrode layer 220 is a metal gate such as TiN or TaN.

Figure 3:
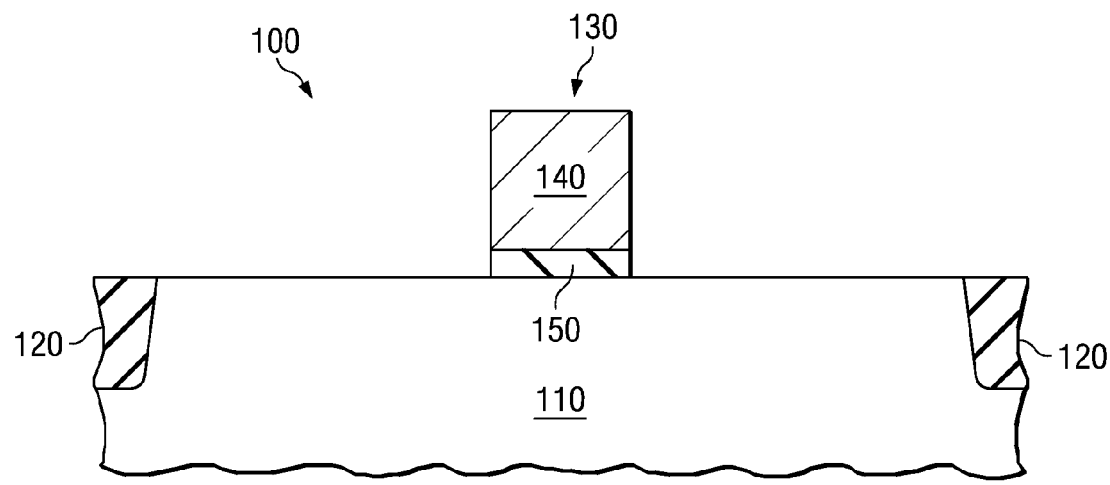

FIG. 3 illustrates the transistor 100 after formation of the gate structure 130. The gate structure 130 may be formed conventionally by any currently existing technique such as photolithography and plasma etch, or by any future discovered technique. In the illustrated embodiment, the gate dielectric layer 210 has been substantially completely removed from areas not protected by the gate electrode 140. In some other embodiments, a portion of the gate dielectric layer 210 remains after formation of the gate structure 130.

Figure 4:
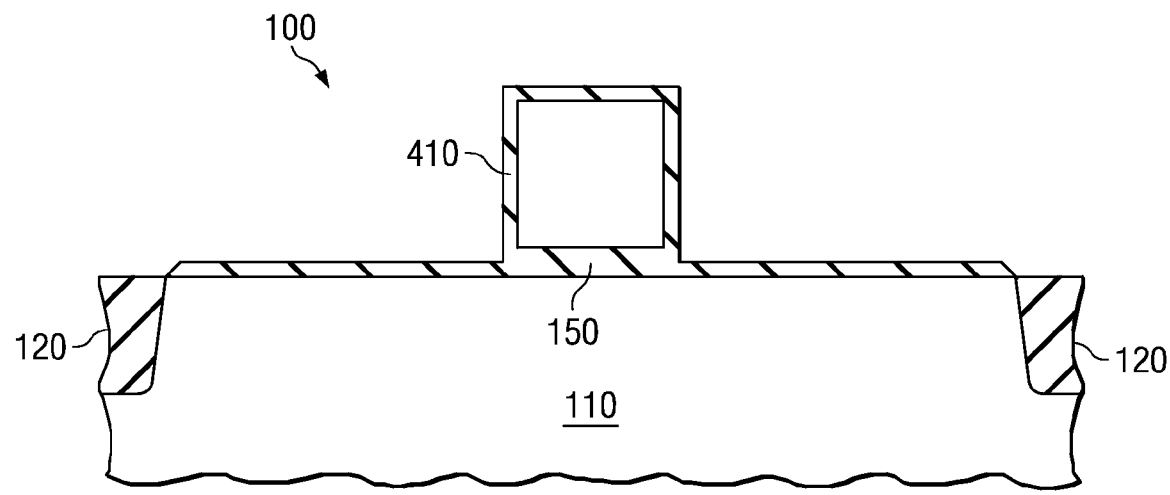

FIG. 4 illustrates the transistor 100 after formation of an oxide layer 410. The oxide layer 410 may be formed by thermal oxidation, e.g. When portions of the dielectric layer 210 remain after formation of the gate structure 130, those portions may be incorporated into the oxide layer 410. The oxide layer 410 seals the gate dielectric 150, and as described below, is removed at a later stage of processing.

Figure 5:
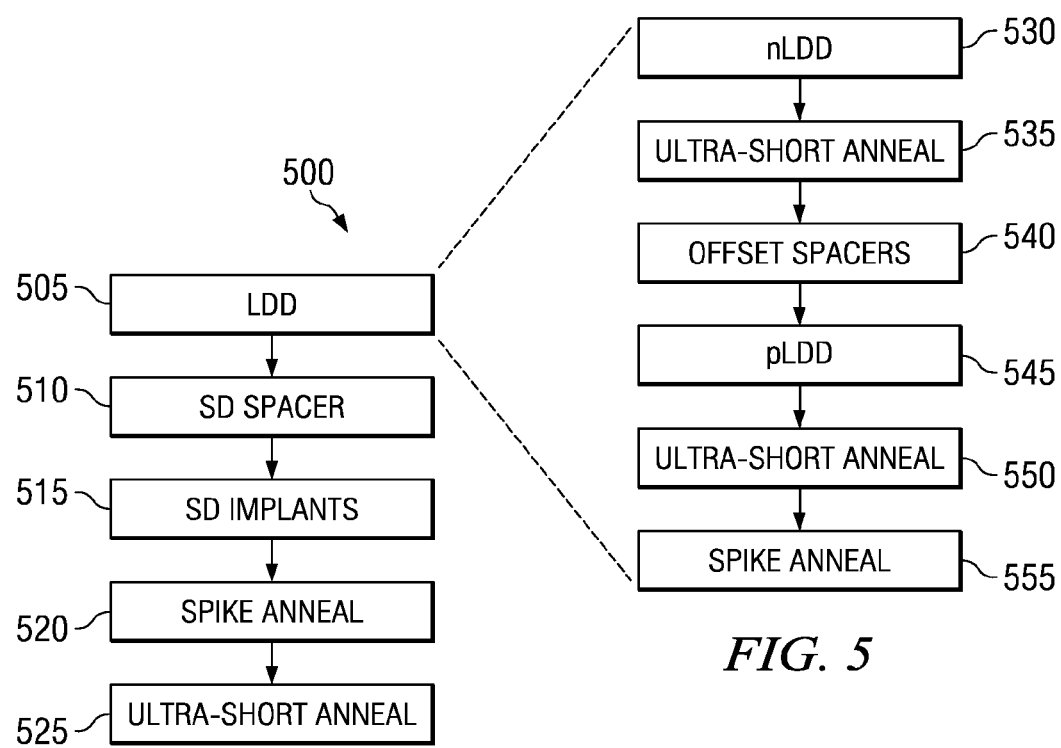
FIG. 5 illustrates a method of making a transistor as covered by one embodiment.

FIG. 5 illustrates a source/drain process loop 500. This processing loop includes steps 505 through 525. In the following discussion, continued reference will be made to FIG. 5. In a step 505, lightly-doped regions are formed. In some cases, the source/drain extension regions 180 are formed by lightly-doped (LDD) regions as illustrated. However, it is contemplated that the embodiments herein may include medium-doped (MDD) or highly-doped (HDD) source/drain extension regions 180. In step 510 source/drain spacers are formed to offset the source and drain regions 187 from the transistor channel 190. In step 515, the source/drain dopants are implanted into the substrate 110. A spike anneal is conducted. In the illustrated embodiment, in step 520 the spike anneal may be conducted at a temperature between about 1000° C. and 1050° C., with duration of 1-3 seconds. This spike anneal is performed to diffuse the source/drain implants and anneal lattice damage.

In step 525, an ultra-short anneal is performed to increase activation of the source/drain dopants. In the present context, ultra-short means a duration less than about 5 ms. In some embodiments, however, an ultra-short anneal is about 2 ms or less. In other embodiments, it may be about 1 ms or less. Extremely high temperature refers to a temperature of about 1100° C. or more. In some embodiments, the temperature is about 1200° C. or more. In still other embodiments, the temperature is about 1300° C. or more. In step 525, the ultra-short anneal may be a laser or flash anneal at about 1235° C. with a duration of about 1 ms.

Step 505 includes steps 530 through 555. In step 530, an n-type dopant is implanted into lightly-doped regions 185 of nMOS transistors. This implant is referred to herein as an nLDD implant. The n-type dopant may be phosphorous (P) or arsenic (As), e.g. While only one n-type doping step is shown, it is contemplated that a manufacturing process may include multiple separate implants for different transistor types, such as high-voltage and low-voltage transistors, e.g. For brevity, in the following discussion, only one nLDD implant is performed.

In step 535, the substrate may optionally be subjected to an ultra-short anneal, as described in detail above. In step 540, offset spacers are formed on the sidewalls of the gate structure 130 of the pMOS transistors. In step 545, a p-type dopant is implanted into lightly-doped regions of pMOS transistors. This implant is referred to herein as a pLDD implant. The p-type dopant may be boron (B), e.g. Again, multiple transistor types with different pLDD implant conditions may be accommodated. In step 550, the substrate may again optionally be subjected to an ultra-short anneal. In step 555, the substrate is subjected to a spike anneal at 900° C.-950° C. for 2.5 seconds, e.g. After step 555, the manufacturing process proceeds to step 510 for source/drain spacer formation.

Figure 6:
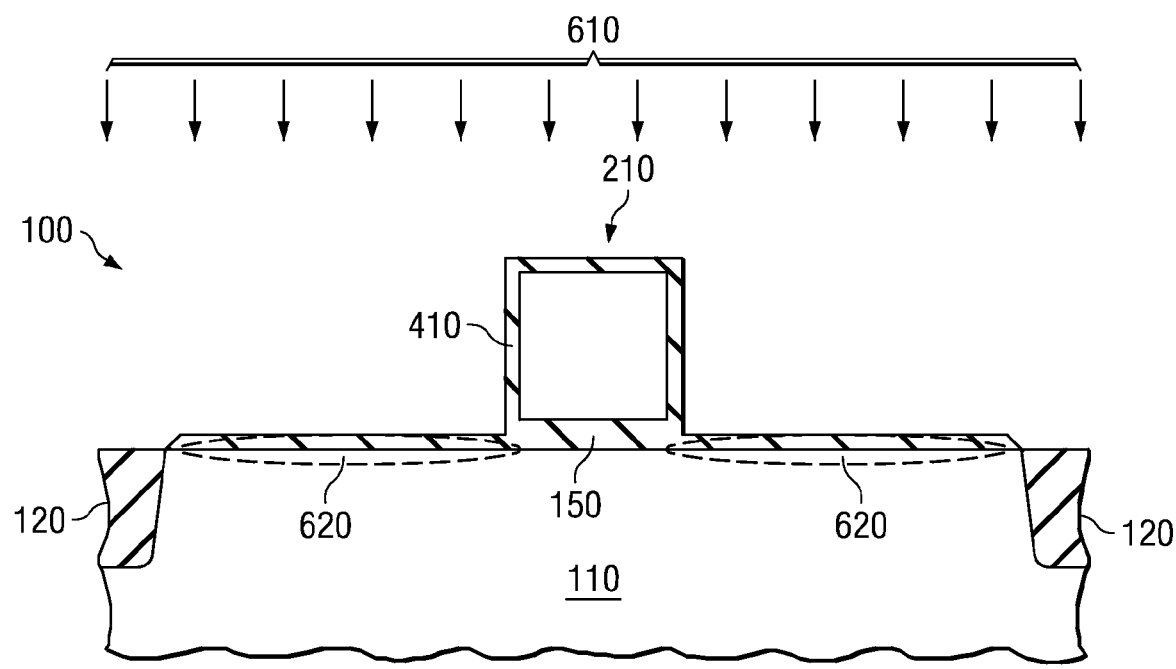

FIG. 6 illustrates an implant process 610 implanting a dopant into lightly-doped regions 620. Unless stated otherwise, the following discussion relates to formation of the n-type and p-type lightly-doped regions. The p-type dopant and the n-type dopant are referred to collectively as an LDD dopant. The lightly-doped regions 620 will merge with the source/drain dopants implanted at step 515 to form the source/drains 170 and source/drain extension regions 180. General characteristics of the lightly-doped regions 620 include shallower implant depth than the source/drain implants and lower dopant concentration than the source/drain regions 187. The LDD dopant implant conditions will depend in part on the dopant, implanted depth, and desired sheet resistance of the source/drain extension regions 180. As a non-limiting example, when As is implanted, the implant process 610 may be designed to implant about 1e14-5e15 cm$^{-3}$ at an energy of about 1-5 keV to result in a sheet resistance of about 500-1500 Ω/square. Note that the lightly-doped regions 620 overlap a portion of the oxide layer 410 and the substrate 110.

Figure 7:
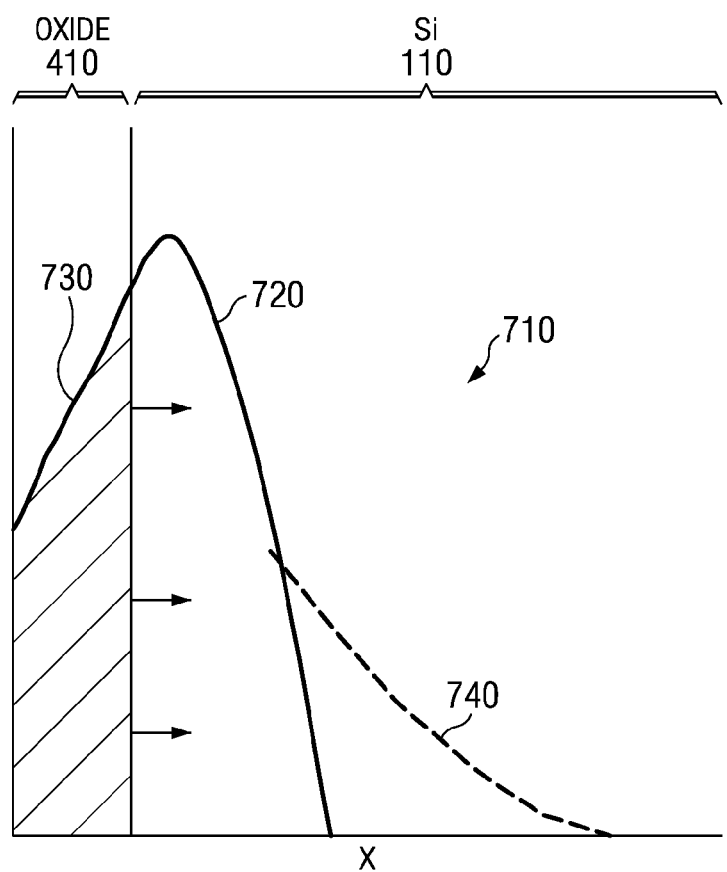
FIGS. 7 and 9 illustrate a dopant concentration profile in a substrate.

FIG. 7 illustrates the distribution of dopant in greater detail. The dopant concentration is described by an as-implanted profile 710. A peak concentration 720 may occur in the substrate 110, but the relatively low energy used for the implant process 610 results in an as-implanted portion 730 of the dopant being left in the oxide layer 410. The oxide layer 410 is typically removed at a later stage of processing (e.g., step 510, source/drain spacer formation), resulting in loss of the dopant therein. Therefore, the sheet resistance of the source/drain extension regions 180 may be higher than it would otherwise be without loss of dopant, resulting in reduced transistor performance. Furthermore, the thickness of the oxide layer 410 may vary across the substrate 110. Thus, the depth of the peak concentration 720 and the doping of the source/drain extension region 180 may similarly vary. Such variability may contribute to inconsistency of transistor performance in different locations on the substrate 110.

In principle, the amount of dopant remaining in the oxide layer 410 could be reduced by increasing the implant energy of the LDD dopant. However, such an increase may result in a tail 740 in the dopant distribution. Undesirably, the tail 740 would result in a deeper junction, and the junction would not be as abrupt. Moreover, while the spike anneal at step 555 may cause some of the dopant to diffuse from the oxide layer 410, the temperature used, between about 900° C. and about 950° C., is insufficient to adequately activate the LDD dopant. The spike anneal may also result in dopant diffusion which results in an undesirable increase of junction depth.

The embodiments herein reflect the present recognition that an ultra-short, extremely high temperature anneal after LDD implant may used to cause some of the portion 730 of the dopant to diffuse into the substrate 110 prior to the spike anneal at step 555. It is recognized that under properly chosen conditions, the dopant in the oxide layer 410 will diffuse into the substrate 110 faster than the dopant in the substrate 110 will diffuse deeper into the substrate 110. Thus, the distribution of the dopant in the substrate 110 can be tightened prior to the later anneal.

Figure 8:
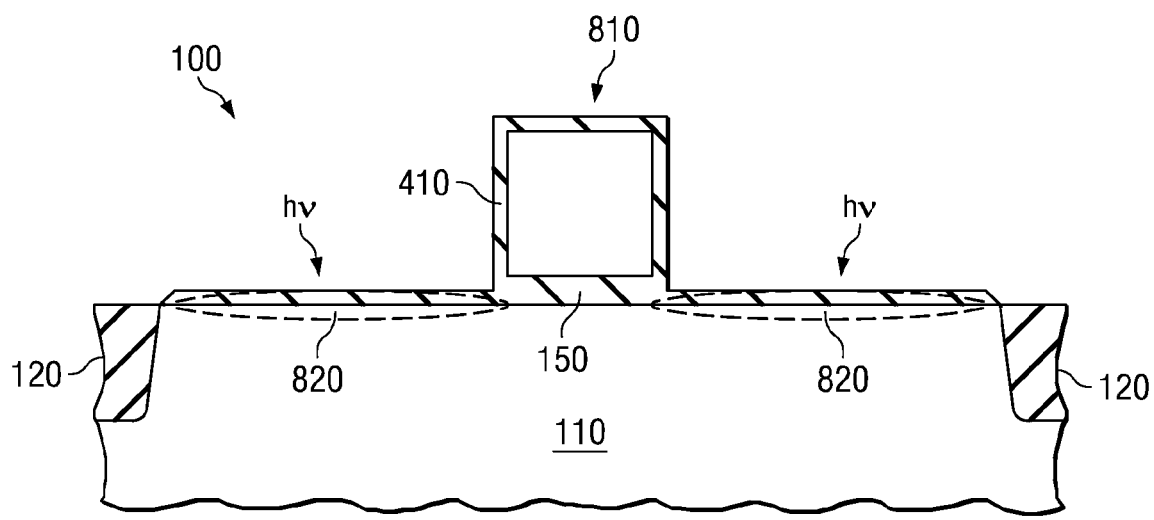

FIG. 8 illustrates the transistor 100 during exposure to an ultra-short anneal 810. The ultra-short anneal 810 may optionally be employed at step 535, step 550, or both. The ultra-short anneal 810 may be any means of providing a temperature of ranging from about 1100° C. to about 1300° C. for about 5 ms or less.

In one embodiment, the ultra-short anneal 810 is provided by a flash anneal process tool. One example of a suitable flash anneal process tool is the 3000 RTP flash anneal tool manufactured by Mattson Technology, Freemont, Calif. In another embodiment, a laser anneal tool is used, such as the LSA100 manufactured by Ultratech, San Jose, Calif, USA. In one embodiment, the ultra-short anneal 810 heats the surface of the substrate to about 1175° C. for a duration ranging from about 0.5 to about 2 ms, preferably about 0.8 ms.

A laser anneal process tool provides coherent photons having energy hv to the substrate 110 to raise the temperature thereof. The laser may be a continuous wave (CW) source, such as a $CO_2$ laser. The laser output may be scanned across the substrate 110 at a rate determined to provide the desired temperature for the desired duration. Alternatively, the laser output may be modulated to deliver a short pulse of energy to produce the desired surface temperature. In one embodiment, laser pulse duration of between about 200 μs and about 5 ms is used with a power density between about 0.2 kW/mm$^2$ and about 1 kW/mm$^2$. In an embodiment, the ultra-short anneal is repeated one or two times. Preferably, the duration ranges from about 0.8 ms to about 1.6 ms with a power density of about 0.4 kW/mm², resulting in a surface temperature of about 1175° C.

Figure 9:
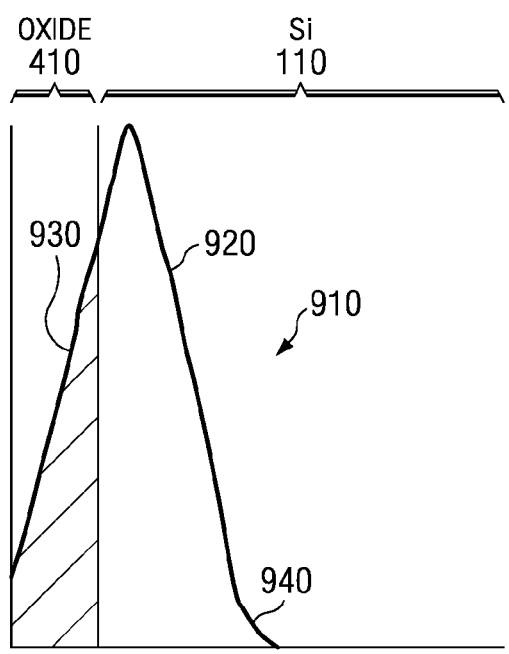

FIG. 9 illustrates a dopant profile 910 after performing the ultra-short anneal 810. It is thought that the profile 910 substantially retains the characteristics of the as-implanted dopant profile 710. A peak concentration 920 is higher than the peak concentration 720 of the as-implanted dopant profile 710. Without limitation by theory, the higher peak concentration 920 is thought to result from greater diffusion of dopant from the oxide layer 410 into the substrate 110 than diffusion of the dopant deeper into the substrate 110. A portion 930 of the dopant in the oxide layer 410 is similarly reduced from the as-implanted portion 730. While the ultra-short anneal 810 may result in a small tail 940 of the dopant concentration, any negative effects of such a tail are thought to be negligible in contrast to the benefits of moving dopant from the oxide layer 410 to the substrate 110.

Figure 10:
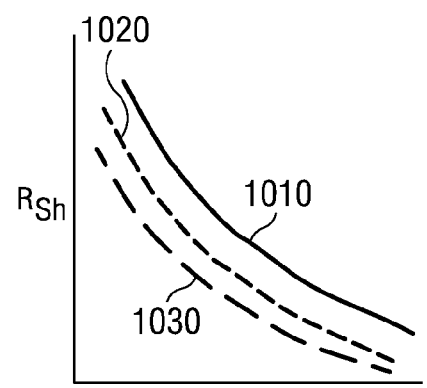
FIG. 10 illustrates lightly-doped region sheet resistance.

Performing the ultra-short anneal 810 after the LDD implant advantageously results in lowering the sheet resistance of the source/drain extension regions 180 after source/drain processing is complete. FIG. 10 illustrates the sheet resistance of a doped region as a function of junction depth $X_j$ for three alternate manufacturing sequences. A characteristic 1010 results when only the spike anneals 555 and 520 are performed in the source/drain loop 500. A characteristic 1020 results when the ultra-short anneal 525 after the source/drain implants 515 are also performed. A characteristic 1030 results from adding the ultra-short anneal 535 after nLDD implant 530 (for nMOS transistors) or the ultra-short anneal 550 after the PLDD implant 550 (for pMOS transistors).

The illustrated characteristics 1010, 1020, 1030 demonstrate that the addition of the ultra-short anneal at 535 or 550 results in lower sheet resistance at a given junction depth than the spike anneals alone at steps 555 and 520 or in combination with the ultra-short anneal at step 525. Without limitation by theory, it is thought that the reduction of the sheet resistance of the characteristic 1030 below that of characteristic 1020 results from increased activation of the LDD dopant by the ultra-short anneal process 810. Thus, more dopant atoms are incorporated into the silicon lattice to participate in conduction, resulting in a lower sheet resistance. The addition of the ultra-short anneal after LDD implant thus advantageously provides additional process latitude to minimize the junction depth of the extension while meeting the sheet resistance specification of the transistor design.

Figure 11:
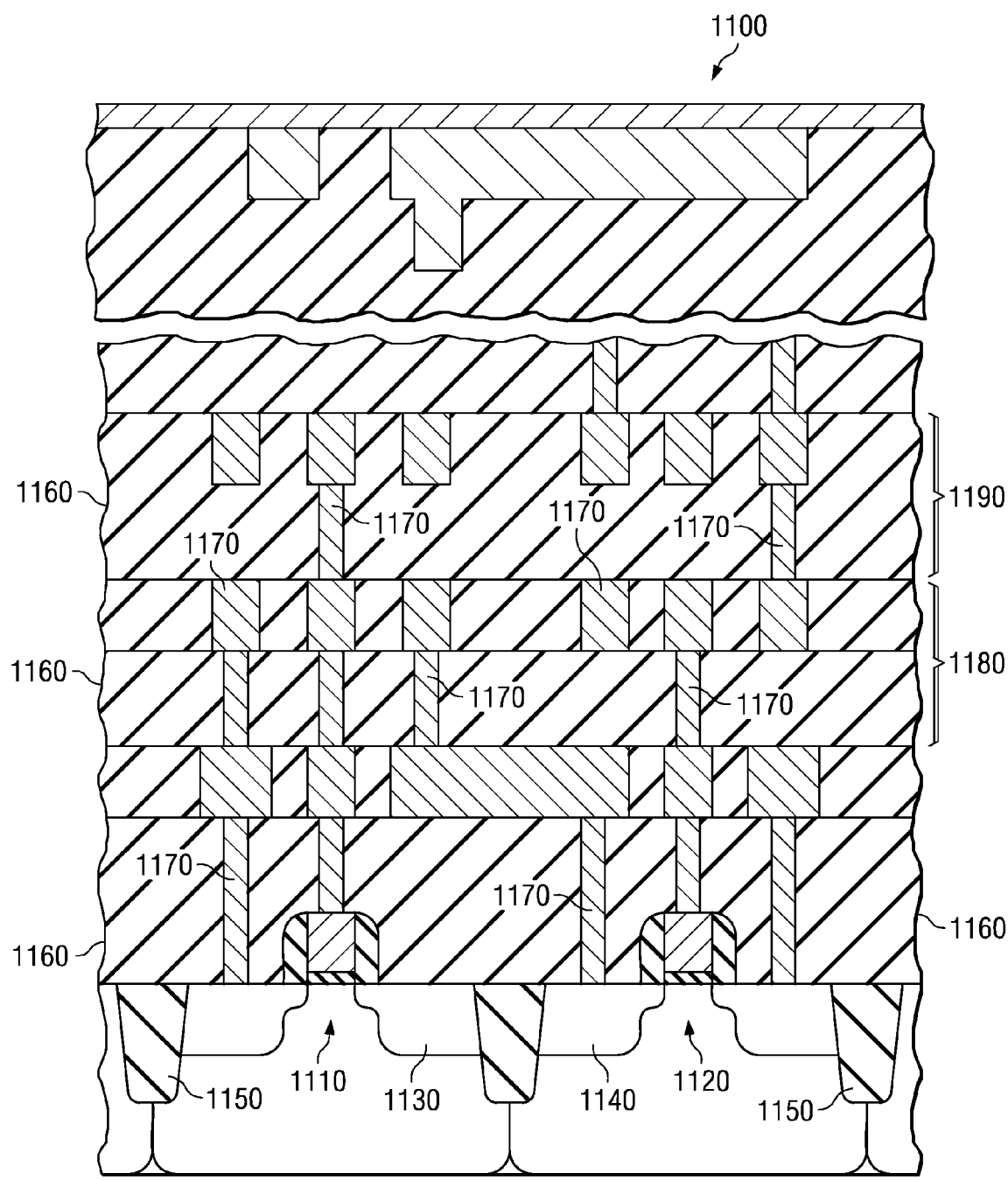
FIG. 11 illustrates a semiconductor device.

FIG. 11 illustrates a sectional view of a semiconductor device 1100. The device 1100 includes an nMOS transistor 1110 and a pMOS transistor 1120. The transistors 1110, 1120 have source/drain regions 1130, 1140, respectively. One or both of the source/drain regions 1130, 1140 are formed using an ultra-short anneal process as described herein. The transistors 1110, 1120 are isolated by an isolation structure 1150. Dielectric layers 1160 are formed over the transistors 1110, 1120. Interconnects 1170 are formed therein and configured to connect to other circuit components in the device 1100. The interconnects 1170 may be formed using a single damascene 1180 or a dual damascene 1190 architecture. The interconnects 1170 are configured to connect the transistors to other circuit components, including other transistors operating at a same or different voltage supply or gate voltage. Other circuit components may include MOS or bipolar transistors, optical devices and interconnects, diodes, capacitors and the like. The device 1100 may include any number of interconnect levels called for by the design of the device 1100.

Those skilled in the art will appreciate that other and further additions, deletions, substitutions and modifications may be made to the described embodiments without departing from the scope the disclosure set forth herein.

What is claimed is:

1. A method of manufacturing a semiconductor device, comprising:
    forming a gate dielectric layer over a semiconductor substrate;
    forming a gate electrode over the gate dielectric layer;
    implanting a dopant into an extension region of the semiconductor substrate with a peak concentration of said dopant located in said substrate, an amount of the dopant remaining in a dielectric layer adjacent the gate electrode; and
    annealing the substrate at a temperature of about 1000° C. or greater to cause at least a portion of the amount of the dopant remaining in the dielectric layer to diffuse into the semiconductor substrate, thereby increasing the peak concentration in the substrate at the completion of the anneal.

2. The method as recited in claim 1, wherein the substrate is annealed for a period of about 2 ms or less.

3. The method as recited in claim 1, wherein the substrate is annealed at a temperature ranging from about 1100° C. and about 1300° C.

4. The method as recited in claim 1, wherein the substrate is annealed for a period ranging from about 0.8 ms to about 1.6 ms.

5. The method as recited in claim 1, wherein the substrate is annealed at about 1175° C. for about 0.8 ms.

6. The method as recited in claim 1, wherein the annealing is performed using a laser anneal.

7. The method as recited in claim 6, wherein the dielectric layer adjacent the gate electrode is an oxide layer formed after the gate electrode.

8. The method as recited in claim 1, wherein the annealing is performed after nLDD implant or after pLDD implant.

9. The method as recited in claim 1, wherein the annealing is only performed after nLDD implant and before pLDD implant.

10. A method of manufacturing a semiconductor device, comprising:
    forming a gate dielectric layer over a semiconductor substrate;
    placing a gate electrode layer over the gate dielectric layer;
    patterning the gate electrode layer and the gate dielectric layer to form a gate electrode structure;
    implanting a dopant into an extension region of the semiconductor substrate with a peak concentration of said dopant located in said substrate, an amount of the dopant remaining in a dielectric layer adjacent the gate structure; and
    annealing the substrate for a period of about 2 ms or less and at a temperature of at least about 1000° C. to cause at least a portion of the amount of the dopant to diffuse from the dielectric layer adjacent the gate structure into the semiconductor substrate, thereby increasing the peak concentration in the substrate at the completion of the anneal.

11. The method as recited in claim 10, wherein the substrate is annealed at a temperature ranging from about 1100° C. and about 1300° C.

12. The method as recited in claim 10, wherein the substrate is annealed for a period ranging from about 0.5 ms to about 1.6 ms.

13. The method as recited in claim 10, wherein the substrate is annealed at about 1175° C. for about 0.8 ms.

14. The method as recited in claim 10, wherein the annealing is performed using a laser anneal.

15. The method as recited in claim 14, wherein the dielectric adjacent the gate electrode is an oxide film formed after forming the gate electrode.

16. The method as recited in claim 14, wherein the annealing is performed after nLDD implant or after pLDD implant.

17. The method as recited in claim 14, wherein the annealing is only performed after nLDD implant and before pLDD implant.

* * * * *